United States Patent
Sha

(10) Patent No.: US 7,112,241 B2
(45) Date of Patent: Sep. 26, 2006

(54) PROTEIN CRYSTALLOGRAPHY HANGING DROP MULTIWELL PLATE

(75) Inventor: Ma Sha, Boxborough, MA (US)

(73) Assignee: Corning Incorporated, Corning, NY (US)

( * ) Notice: Subject to any disclaimer, the term of this patent is extended or adjusted under 35 U.S.C. 154(b) by 318 days.

(21) Appl. No.: 10/694,692

(22) Filed: Oct. 27, 2003

(65) Prior Publication Data

US 2004/0141895 A1   Jul. 22, 2004

Related U.S. Application Data

(60) Provisional application No. 60/437,273, filed on Dec. 31, 2002.

(51) Int. Cl.
 *C30B 7/14* (2006.01)
(52) U.S. Cl. .............. 117/68; 117/69; 117/70; 117/203; 117/933; 422/245.1
(58) Field of Classification Search ............. 117/68, 117/69, 70, 203, 933; 422/245.1
See application file for complete search history.

(56) References Cited

U.S. PATENT DOCUMENTS

| | | | | |
|---|---|---|---|---|
| 5,096,676 A | | 3/1992 | McPherson et al. | 422/245 |
| 5,130,105 A | * | 7/1992 | Carter et al. | 422/215 |
| 5,400,741 A | | 3/1995 | DeTitta et al. | 117/206 |
| 5,419,278 A | * | 5/1995 | Carter | 117/206 |
| 6,056,920 A | * | 5/2000 | Lepre | 422/61 |
| 6,232,114 B1 | | 5/2001 | Coassin et al. | 435/288.4 |
| 2002/0067800 A1 | * | 6/2002 | Newman et al. | 378/73 |
| 2002/0141905 A1 | | 10/2002 | Sha et al. | 422/102 |
| 2002/0189537 A1 | | 12/2002 | Knebel et al. | 117/204 |
| 2003/0150379 A1 | * | 8/2003 | Goodwin. Jr. | 117/204 |
| 2005/0056205 A1 | * | 3/2005 | Goodwin, Jr. | 117/68 |

FOREIGN PATENT DOCUMENTS

| WO | WO 00/47323 | 8/2000 |
|---|---|---|
| WO | WO 01/88231 | 11/2001 |

OTHER PUBLICATIONS

Neuro Probe—Instruments for Biomedical Research—17 pages, http://www.neuroprobe.com, downloaded Apr. 23, 2002.
Hampton Research—Hanging Drop Vapor Diffusion Crystallization—2 pages, http://www.hamptonresearch.com, copyrighted 2000.

* cited by examiner

*Primary Examiner*—Robert Kunemund
(74) *Attorney, Agent, or Firm*—William J. Tucker; Thomas R. Beall

(57) ABSTRACT

The present invention includes a microplate for performing crystallography studies. In particular, the microplate has a frame that includes a plurality of wells formed therein. Each well includes a first well and a second well. The first well includes a relatively large reservoir capable of receiving a reagent solution. The second well includes a relatively small reservoir having a substantially concaved form capable of receiving a protein solution and a reagent solution. The second well is suspended above the first well such that space on the plate is conserved and to enable protein crystal growth utilizing a hanging drop vapor diffusion crystallization process.

18 Claims, 5 Drawing Sheets

[ONLY 8 SLIDES SHOWN]

PROTEIN CRYSTALLOGRAPHY HANGING DROP MULTIWELL PLATE

RELATED APPLICATION

This application claims the benefit of priority from U.S. Provisional Application No. 60/437,273, filed, Dec. 31, 2002, the content of which is incorporated herein by reference.

BACKGROUND OF THE INVENTION

1. Field of the Invention

The present invention relates in general to the biotechnology field and, in particular, to a protein crystallography hanging drop multiwell plate and methods for fabricating and using the protein crystallography hanging drop multiwell plate.

2. Description of Related Art

Today biochemical studies associated with growing protein crystals and other biological crystals are carried out on a large scale in both industry and academia. As such, it is desirable to have an apparatus that allows researchers to perform these studies in a convenient and inexpensive fashion. Because they are relatively easy to handle and low in cost, multiwell plates are often used in these studies. And, if the study involves growing protein crystals via a hanging drop vapor diffusion process, then the wells of a multiwell plate are often covered with slides or a lid having one or more drops of a protein solution and a reagent solution hanging therefrom which turn into the protein crystals. In particular, the drops hanging from the bottom side of the slides or lid turn into protein crystals by interacting via a vapor diffusion process with a higher concentrated reagent solution located within each well of the multiwell plate. However, the traditional slides or lid used to grow protein crystals in this manner have several drawbacks which are described in greater detail below with reference to FIGS. 1–3.

Referring to FIGS. 1A–1B (PRIOR ART), there are illustrated different views of one set of traditional slides 100 designed to cover the wells 104 in a multiwell plate 102. Each slide 100 typically has a circular shape and is sized to fit over one of the wells 104 in the multiwell plate 102. And, each well 104 includes a rim 106, sidewalls 108 and a bottom 110 (see FIG. 1B). The wells 104 are generally arranged in a matrix of mutually perpendicular rows and columns. For example, the multiwell plate 102 can include a matrix of wells 104 having dimensions of 4×6 (24 wells), 8×12 (96 wells) and 16×24 (384 wells). The multiwell plate 102 shown includes an array of ninety-six wells 104.

To grow a protein crystal on the bottom side of one slide 100, the researcher applies a bead of grease 112 (e.g., high vacuum grease) along the rim 106 of one of the wells 104. Typically, the researcher would leave a small opening such as 2 mm between the start and end of the bead of grease 112. The researcher then pipets a small amount (e.g., 1.0 millimeter) of a reagent solution 114 into the well 104. One or more drops 116 (only one shown) including a small amount of a protein sample (e.g., 1.0 microliter) and a small amount of a reagent solution (1.0 microliter) that can be taken from the well 104 are then pipetted onto a bottom side of the slide 100. Thereafter, the researcher inverts the slide 100 so that the drop 116 is hanging down from the slide 100 and then positions and places the slide 100 onto the grease 112 around the well 104. To relieve the air pressure within the well 104, the researcher presses the slide 100 down onto the grease 112 and twists the slide 100 to close the small opening in the grease 112. This process is then completed for each well 104 in the multiwell plate 102. Unfortunately, there are a number of disadvantages associated with using the slides 100 and the multiwell plate 102. First, the researcher must work with messy grease 112 and possibly spend a lot of time applying the grease 112 to the rims 106 of each well 104. Secondly, the researcher must work with and handle a large number of relatively small slides 100 to utilize all of the wells 104 in the multiwell plate 102. Thirdly, the slides 100 and the grease 112 are expensive.

Referring to FIGS. 2A–2B (PRIOR ART), there are illustrated different views of another set of traditional slides 200 designed to cover the wells 204 in a multiwell plate 202. Each slide 200 typically has a circular shape and is sized to be placed on a ledge 203 in one of the wells 204 in the multiwell plate 202. And, each well 204 includes a rim 206, sidewalls 208 and a bottom 210. The wells 204 are generally arranged in a matrix of mutually perpendicular rows and columns. For example, the multiwell plate 202 can include a matrix of wells 204 having dimensions of 4×6 (24 wells), 8×12 (96 wells) and 16×24 (384 wells). The multiwell plate 202 shown includes an array of ninety-six wells 204.

To grow a protein crystal on the bottom side of one slide 200, the researcher pipets a small amount (e.g., 1.0 millimeter) of a reagent solution 214 into the well 204. One or more drops 216 (only one shown) including a small amount of a protein sample (e.g., 1.0 microliter) and a small amount of a reagent solution (1.0 microliter) that can be taken from the well 204 are then pipetted onto a bottom side of the slide 200. Thereafter, the researcher inverts the slide 200 so that the drop 216 is hanging down from the slide 200 and then positions and places the slide 200 onto the ledge 203 within the well 204. After, this process is completed for each well 204 in the multiwell plate 202, then the researcher places one or more strips of tape 218 (only shown in FIG. 2B) over the top of multiwell plate 202. Unfortunately, there are a number of disadvantages associated with using the slides 200 and the multiwell plate 202. First, the researcher must work with and handle a large number of relatively small slides 200 to utilize all of the wells 204 in the multiwell plate 202. Secondly, the researcher must cut the tape 218 in order to have access to anyone of the slides 200 located within a particular well 204. Thirdly, the slides 200 are expensive.

Referring to FIGS. 3A–3B (PRIOR ART), there are illustrated different views of a traditional lid 300 designed to cover the wells 312 in a multiwell plate 302. The lid 300 includes a rigid frame 304 that supports a filter membrane 306 on which there is placed a hydrophobic mask 308 all of which are protected by a removable cover 310 (see exploded view in FIG. 3B). The lid 300 is sized to fit over all of the wells 312 in the multiwell plate 302. And, each well 312 includes a rim 314, sidewalls 316 and a bottom 318. The wells 312 are generally arranged in a matrix of mutually perpendicular rows and columns. For example, the multiwell plate 302 can include a matrix of wells 312 having dimensions of 4×6 (24 wells), 8×12 (96 wells) and 16×24 (384 wells). The multiwell plate 302 shown includes an array of ninety-six wells 312.

To grow a group of protein crystals on top of the hydrophobic mask 308 of the lid 300, the researcher applies a bead of grease 320 (e.g., high vacuum grease) on the rims 314 of the wells 312 in the event the wells 312 are not pre-greased. The researcher then pipets a small amount (e.g., 1.0 millimeter) of a reagent solution 322 into each well 312. One or more drops 324 (eight drops 324 are shown) including a small amount of a protein sample (e.g., 1.0 microliter) and a small amount of a reagent solution (1.0 microliter) that can be taken from the well 104 are then pipetted onto the hydrophobic mask 308 of the lid 300. Thereafter, the researcher positions the lid 300 over the multiwell plate 302 and then pushes the lid 300 down onto the grease 322 located around each well 312. The lid 300 can have holes 326 formed in the frame 304. And, the multiwell plate 302 can have pins 328 extending up therefrom which fit into the holes 326 in the frame 304 to assure that the lid 300 is properly aligned with the multiwell plate 302. Unfortunately, there are a number of disadvantages associated with using the lid 300 and the multiwell plate 302. First, the researcher must work with messy grease 320 and possibly spend a lot of time applying the grease 320 to the rims 314 of the wells 312. Secondly, the filter membrane 306 and hydrophobic mask 308 of the lid 300 are very fragile and can easily break. Thirdly, the lid 300 is very expensive. Finally, the lid must be flipped after crystallization in order to harvest the crystals.

Accordingly, there is and has been a need for a cost effective and user-friendly multiwell plate that integrates features of the lids, without requiring the lid and the accompanying drawbacks associated with their use. This need and other needs are satisfied by the multiwell plate and the methods of the present invention.

BRIEF DESCRIPTION OF THE INVENTION

The present invention includes a multiwell plate that is equipped with a plurality of well units, each comprised of a hanging drop or protein well positioned over a reservoir well. Access to both the protein well as well as the reservoir well may be accomplished from above. The reservoir well is accessed through an access port that is in fluid communication with the plate surface. The plate is preferably a unitary molded unit. The protein well preferably contains a center hole that is sized to retain by surface tension the protein drop that has been placed therein. In operation, the multiwell plate is used in conjunction with sealing tape or an appropriate lid in order to grow protein crystals using a hanging drop vapor diffusion crystallization process.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Referring to FIGS. 4–5, there are disclosed in accordance with the present invention two embodiments of a multiwell plate 400 and 500. Although the multiwell plate 400, 500 are described as being used to grow protein crystals using a hanging drop vapor diffusion crystallization process, it should be understood that the multiwell plate is not limited to this application. Instead, the multiwell plate 400, 500 can be used to perform a wide variety of applications including one where the plate simply ensures that a solution remains within the wells of the multiwell plate. Accordingly, the multiwell plate 400, 500 should not be construed in a limited manner.

Figure 1A:
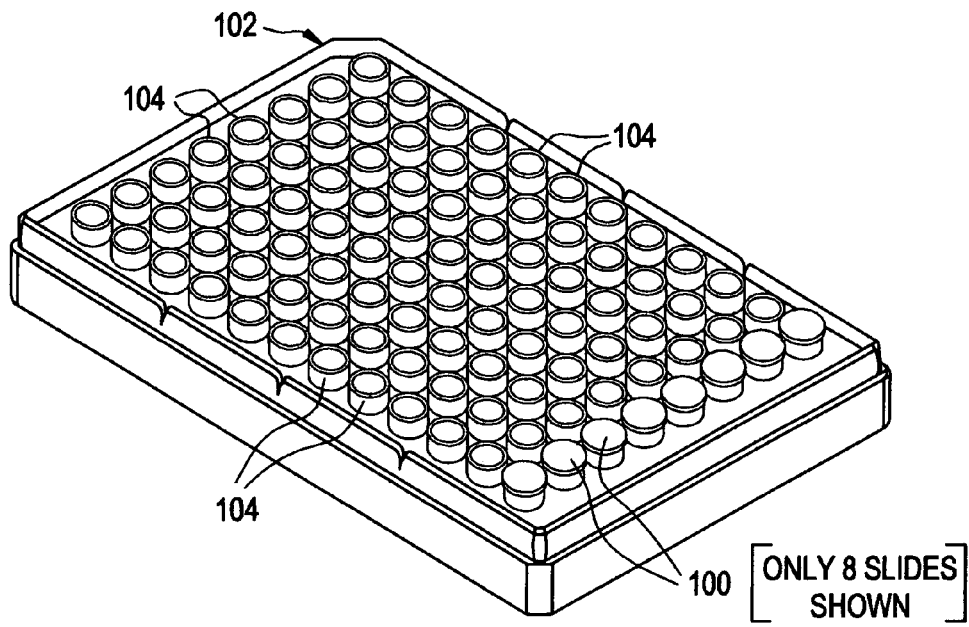
FIGS. 1A–1B (PRIOR ART) illustrates different views of one set of traditional slides made by Hampton Research Corporation that are designed to cover the wells in a multiwell plate.
Figure 1B:
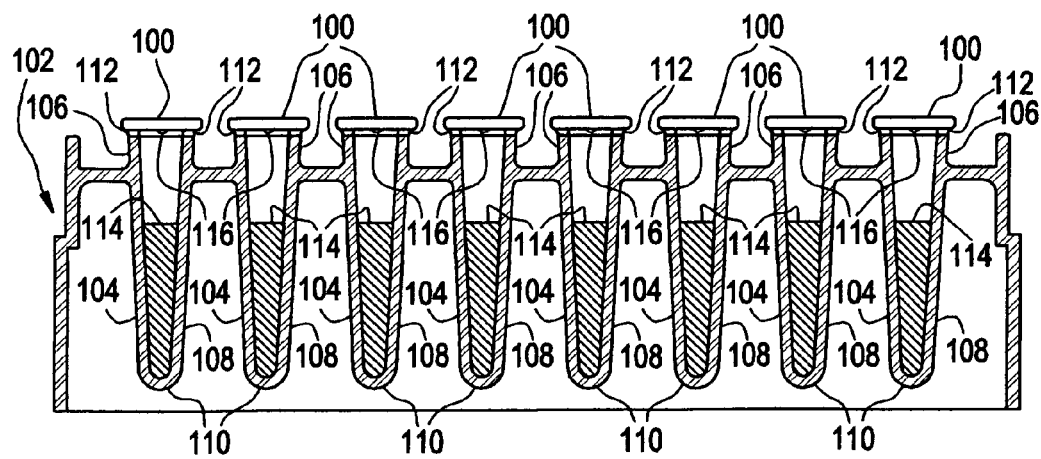
Figure 2A:
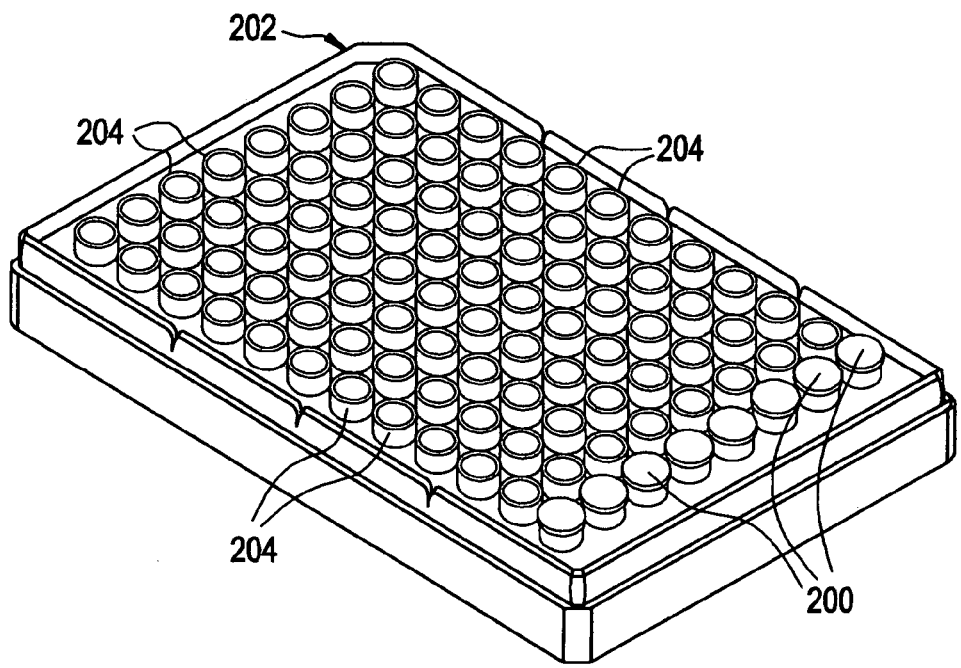
FIG. 2A–2B (PRIOR ART) illustrates different views of another set of traditional slides made by Hampton Research Corporation that are designed to cover the wells in a multiwell plate.
Figure 2B:
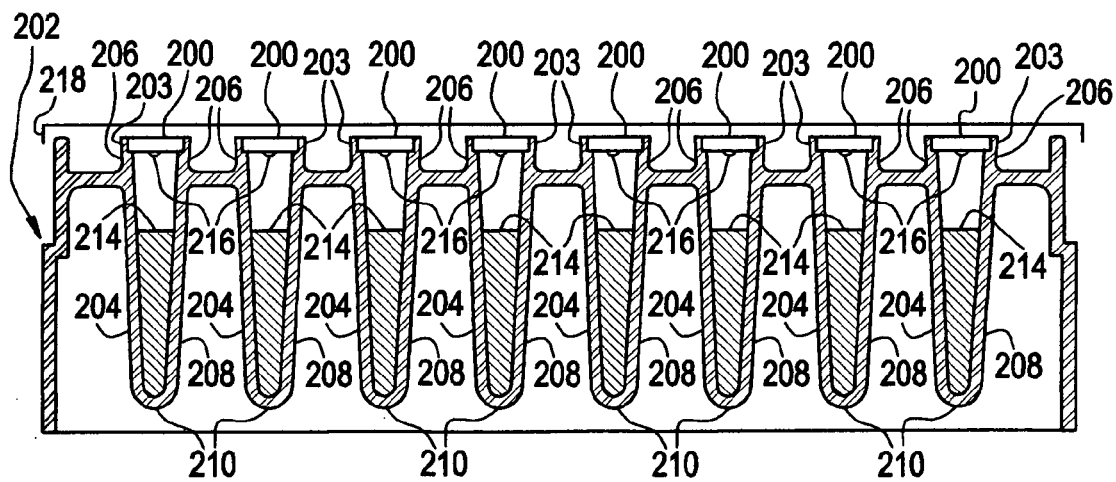
Figure 3A:
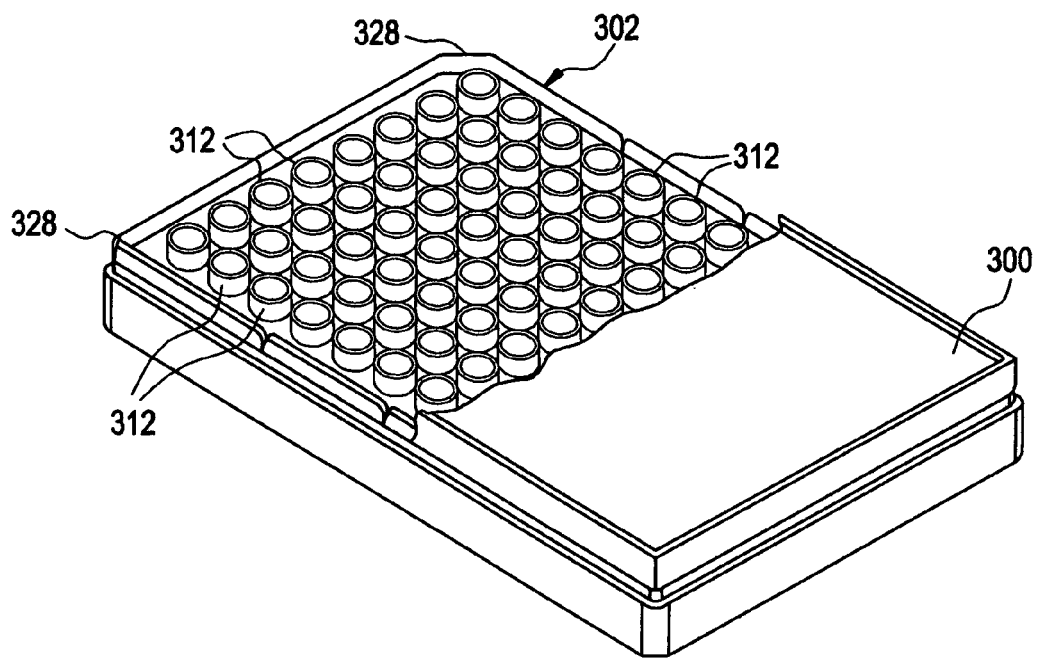
FIG. 3A–3B (PRIOR ART) illustrates different views of a traditional lid made by Neuro Probe Incorporated that is designed to cover the wells in a multiwell plate.
Figure 3B:
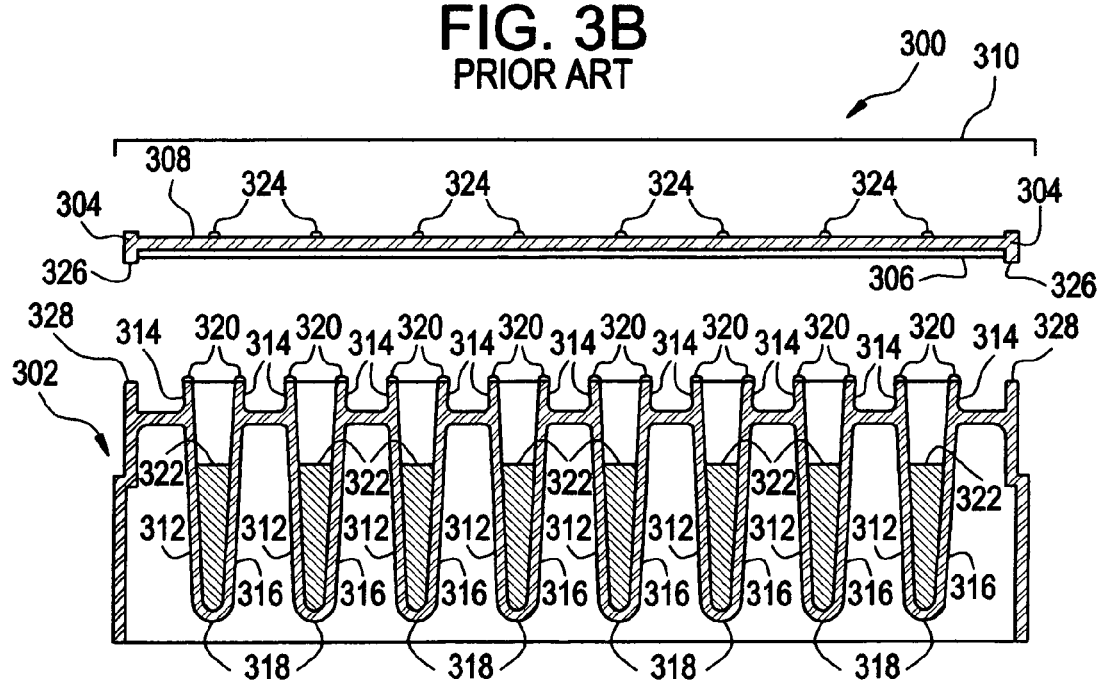
Figure 4A:
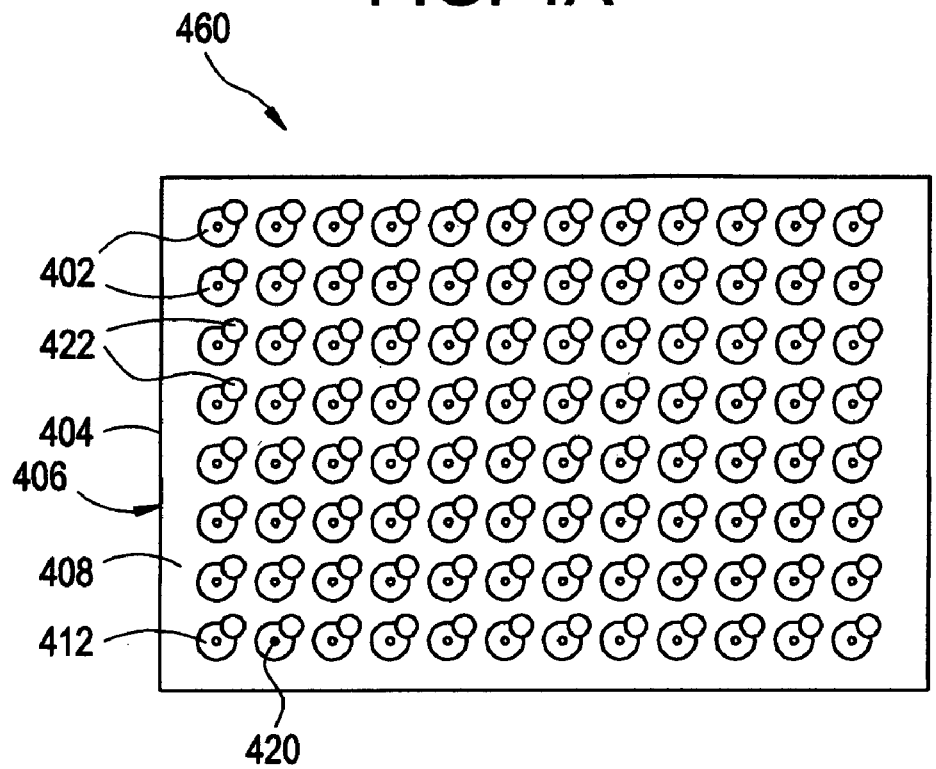
FIGS. 4A–4C respectively illustrate a top view, a partial cross-sectional side view, and a partial top view of an embodiment of a multiwell plate in accordance with the present invention.
Figure 4B:
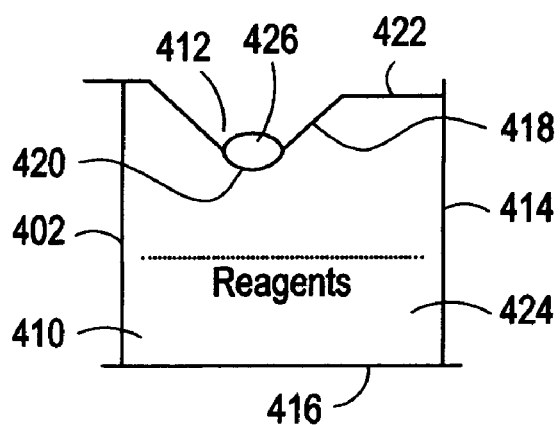
Figure 4C:
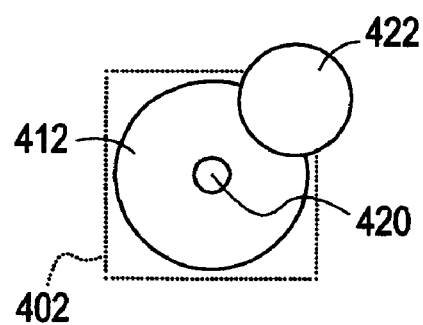

Referring to FIGS. 4A–4C, there are illustrated different views of a first embodiment of a multiwell plate 400 of the current invention. The multiwell plate 400 includes an array of wells 402. The wells 402 are generally arranged in a matrix of mutually perpendicular rows and columns within a frame 404. For example, the multiwell plate 400 can include a matrix of wells 402 having dimensions of 4×6 (24 wells), 8×12 (96 wells) and 16×24 (384 wells) or even 32×48 (1536 wells). The multiwell plate 400 shown includes an array of ninety-six wells 402. The frame 404 supports the wells 402 and includes an outer wall 406 and a top planar surface 408 extending between the outer wall 406 and the wells 402.

Each well 402 of the multiwell plate 400 is defined by a combination of a first or "reservoir well" 410 and a second or "protein well" 412. The reservoir well 410 is defined by generally vertical sidewalls 414 and a bottom 416. The protein well 412 is defined by angled sidewalls 418 which radiate out from a central hole 420. The protein well 412 is affixed to the reservoir well sidewalls 414 as well as the top surface 408 of the frame 404 and is thereby suspended above the reagent well 410. Pipette access to the reservoir well 410 may be accomplished by means of an access port 422 that is in fluid communication with the external environment.

In operation and in order to grow one or more protein crystals using the multiwell plate 400, the researcher pipets a small amount (e.g., 1.0 millimeter) of a reagent solution 424 into each of the reservoir portion 410 of wells 402 through the respective access port 422 (see, FIGS. 4A–4C). One or more drops 426 (only one shown) including a small amount of a protein sample (e.g., 1.0 microliter) and a small amount of a reagent solution (1.0 microliter) that can be taken from the wells 410 are then pipetted into the protein well 412. The hole 420 located in the center of the protein well is sized appropriately to confine the drop 426 to the protein well 412 by means of surface tension. In this position, the drops via a vapor diffusion process turn into protein crystals by interacting with the higher concentrated reagent solution 424 located within the reservoir portion 410 of the wells 402 of the multiwell plate 400. A layer of tape or a rubberized sealing plate (not shown) can be utilized to maintain a fluid seal from the external environment, which is necessary to ensure proper vapor diffusion and crystal growth. By suspending the protein well 412 over the reservoir well 410, it becomes possible to achieve higher well densities on a standard multiwell plate footprint.

Figure 5A:
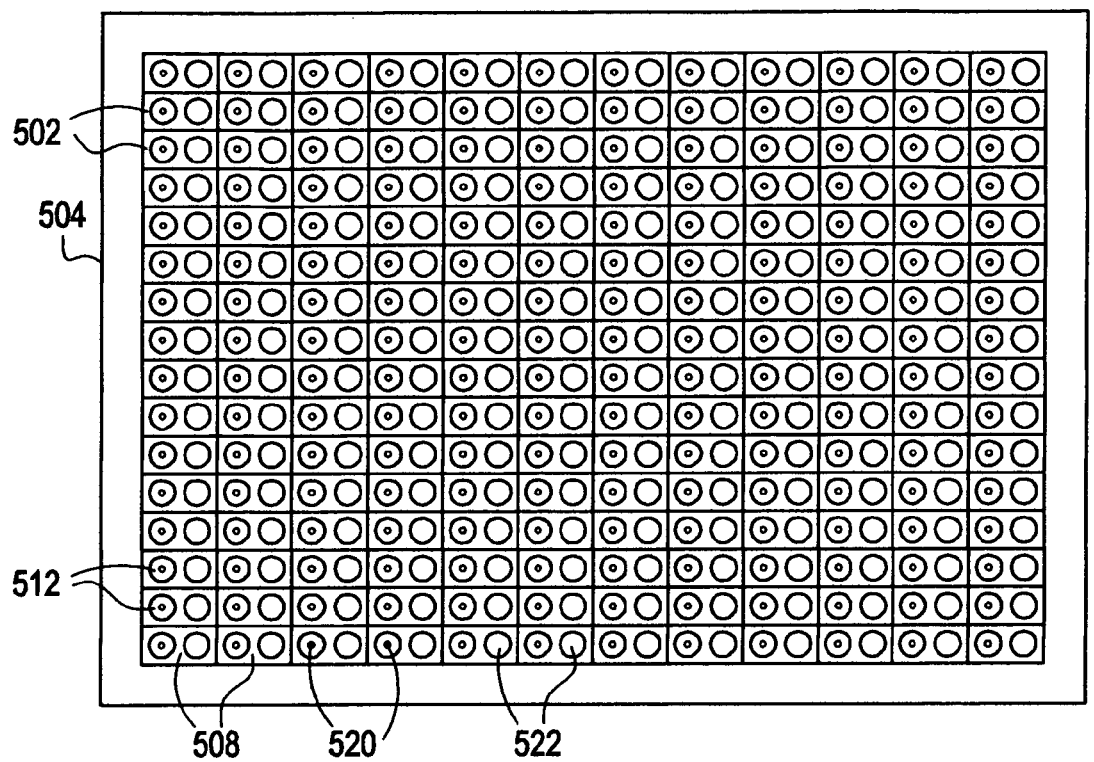
FIGS. 5A–5C respectively illustrate a top view, a partial cross-sectional side view, and a partial top view of a second embodiment of a multiwell plate in accordance with the present invention.
Figure 5B:
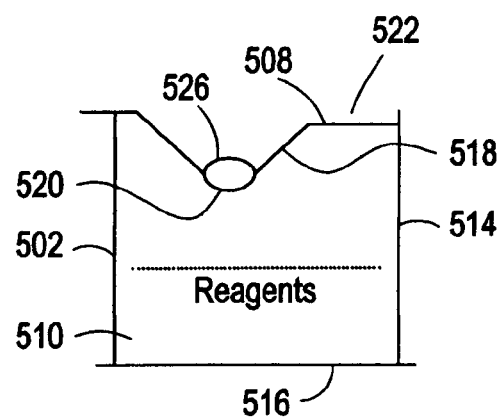
Figure 5C:
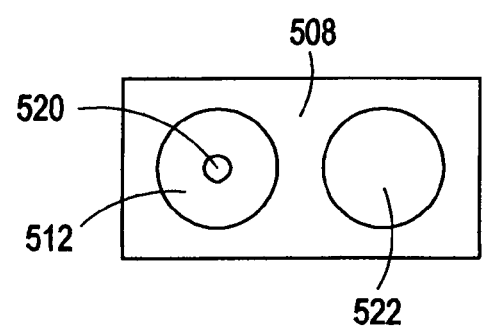

Referring to FIGS. 5A–5C, there are illustrated different views of a second embodiment of a multiwell plate of the present invention. The multiwell plate 500 includes an array of rectangular wells 502. The wells 502 are generally arranged in a matrix of mutually perpendicular rows and columns. For example, the multiwell plate 500 can include a matrix of wells having dimensions of 4×6 (24 wells), 8×12

(96 wells) and 16×24 (384 wells) or even 32×48 (1536 wells). The multiwell plate 500 shown includes an array of three hundred and eighty four wells 502 held within a frame 504.

As in the previous embodiment, each well 502 of the multiwell plate 500 is defined by a combination of a protein well 512 and a reservoir well 510. The reservoir well 510 is defined by generally vertical sidewalls 514 and a bottom 516. The protein well 512 is defined by angled sidewalls 518 which radiate out from a central hole 520. In this embodiment, the reservoir well is generally covered by a top surface 508. A radial depression in this top surface 508 defines the protein well 512. As in the prior embodiment, a hole 520 small enough to retain liquid by surface tension is preferably located at the lower most point of the protein well 512. The protein well 512 is effectively suspended above the reagent well 510. Pipette access to the reservoir well may be accomplished by means of an access port 522 cut into the top surface 508 that is in fluid communication with the external environment.

It should be noted that a hole in the lower most point in the protein well is not required in order for the plate to function properly for protein crystallography studies. Neither is it required that the well have a concave shape. Nevertheless, these characteristics are preferred since the concave shape serves to locate the drop in a central discrete location within the well and the hole serve to enhance the vapor diffusion process.

In operation and in order to grow one or more protein crystals using the multiwell plate 500, the researcher pipets a small amount (e.g., 1.0 millimeter) of a reagent solution into each of the reservoir portion of wells through the respective access port (see, FIGS. 5A–5C). One or more drops 526(only one shown) including a small amount of a protein sample (e.g., 1.0 microliter) and a small amount of a reagent solution (1.0 microliter) that can be taken from the wells are then pipetted into the protein well 512. The hole 520 located in the center of the protein well 512 is sized appropriately to confine the drop 526 to the protein well 512 by means of surface tension. In this position, the drops via a vapor diffusion process turn into protein crystals by interacting with the higher concentrated reagent solution located within the reservoir portion 510 of the wells 502 of the multiwell plate 500. A layer of tape or a rubberized sealing plate (not shown) can be utilized to maintain a fluid seal from the external environment, which is necessary to ensure proper vapor diffusion and crystal growth and to prevent evaporation of the reagents.

Once protein crystals are grown, they may be harvested without manipulation of the plate 400, 500 itself. The crystals may be removed directly from the protein well 412, 512. Further, manipulation of the contents of the reservoir well 412, 512 may be achieved without disturbing the contents of the protein well 412, 512.

Of course, protein wells, reservoir wells, and access ports may take the form of other shapes and locations other than those described above with respect to FIGS. 4A–4C and 5A–5C.

By locating and suspending the protein well over the reservoir itself, the present invention maximizes usage of space on the plate without sacrificing the volume of the reservoir. The invention as described herein allows for manufacture of plates of higher density, in a preferably integral one-piece design.

Still yet another advantage of the present invention is that the multiwell plate 400, 500 can have a footprint that makes it possible for a standard robot handling system to handle the multiwell plate 400, 500. For instance, the multiwell plate 400, 500 can have a specific footprint that makes it possible for a SBS compatible robot handling system to handle the multiwell plate 400, 500. Reference is made to the proposed SBS standards provided below for exemplary dimensions of a SBS footprint compatible multiwell plate 400, 500.

The proposed SBS Standards Nos. 1–4 as downloaded from the SBS website on Feb. 6, 2000 are provided below. It should be understood that the multiwell plate of the present invention can be manufactured to have dimensions that are acceptable to a wide variety of robot handling systems and liquid handling systems which can even be one in the same.

SBS Proposed Standards:

SBS Proposed Standard 1a: Multiwell Plate Footprint
  Footprint
  The outside dimension of the base footprint, measured within 12.7 mm (0.5000 inches) of the outside corners, shall be as follows:
    Length 127.76 mm±0.25 mm (5.0299 inches±0.0098 inches)
    Width 85.48 mm±0.25 mm (3.3654 inches±0.0098 inches)
  The outside dimension of the base footprint, measured at any point along the side, shall be as follows:
    Length 127.76 mm±0.5 mm (5.0299 inches±0.0197 inches)
    Width 85.48 mm±0.5 mm (3.3654 inches±0.0197 inches)
  The footprint must be continuous and uninterrupted around the base of the plate.
  Corner Radius
  The four outside corners of the plate's bottom flange shall have a corner radius to the outside of 3.18 mm±1.6 mm (0.1252 inch±0.0630 inches)

SBS Proposed Standard 2a: Multiwell Plate Height—Standard Height
  Plate Height
  The plate height, measured from Datum A (the resting plane) to the maximum protrusion of the perimeter wells, shall be 14.35 mm±0.25 mm (0.5650 inches±0.0098 inches)
  The overall plate height, measured from Datum A (the resting plane) to the maximum protrusion of the plate, shall be 14.35 mm±0.76 mm (0.5650 inches±0.0299 inches)
  Top Surface
  The maximum allowable projection above the top stacking surface is 0.76 mm (0.0299 inches). The top stacking surface is defined as that surface on which another plate would rest when stacked one on another.
  When resting on a flat surface, the top surface of the plate must be parallel to the resting surface within 0.76 mm (0.0299 inches)
  External Clearance to the Plate Bottom
  The minimum clearance from Datum A (the resting plane) to the plane of the bottom external surface of the wells shall be 1 mm (0.0394 inches). This clearance is limited to the area of the wells.

SBS Proposed Standard 3a: Bottom-Outside Flange Height-Short Flange
  Flange Height
  The height of the bottom outside flange shall be 2.41 mm±0.38 mm (0.0948 inches±0.0150 inches). This is measured from Datum A (the bottom-resting plane) to the top of the flange.
  All four sides must have the same flange height.
  Flange Width The width of the bottom outside flange measured at the top of the flange shall be a minimum of 1.27 mm (0.0500 inches).

Chamfers (Corner Notches)

The quantity and location of chamfer(s) is optional. If used, the chamfer must not include the flange.

SBS Proposed Standard 3b: Bottom-Outside Flange Height—Medium Flange

Flange Height

The height of the bottom outside flange shall be 6.1 mm±0.38 mm (0.2402 inches±0.0150 inches). This is measured from Datum A (the bottom-resting plane) to the top of the flange.

All four sides must have the same flange height.

Flange Width

The width of the bottom outside flange measured at the top of the flange shall be a minimum of 1.27 mm (0.0500 inches).

Chamfers (Corner Notches)

The quantity and location of chamfer(s) is optional. If used, the chamfer must not include the flange.

SBS Proposed Standard 3c: Bottom-Outside Flange Height—Tall Flange

Flange Height

The height of the bottom outside flange shall be 7.62 mm±0.38 mm (0.3000 inches±0.0150 inches). This is measured from Datum A (the bottom-resting plane) to the top of the flange.

All four sides must have the same flange height.

Flange Width

The width of the bottom outside flange measured at the top of the flange shall be a minimum of 1.27 mm (0.0500 inches).

Chamfers (Corner Notches)

The quantity and location of chamfer(s) is optional. If used, the chamfer must not include the flange.

SBS Proposed Standard 3d: Bottom-Outside Flange Height—Short Flange with Interruptions Flange Height The height of the bottom outside flange shall be 2.41 mm±0.38 mm (0.0948 inches±0.0150 es). This is measured from Datum A (the bottom-resting plane) to the top of the flange.

All four sides must have the same flange height except for an allowable interruption centered along the long side.

Interruptions

Each of the long sides of the plate shall be allowed to have a single interruption or projection on center.

Each edge of the interruption shall be a minimum of 48.5 mm (1.9094 inches) from the nearest edge of the part.

The height of the flange at the interruption shall not exceed 6.85 mm (0.2697 inches)

Flange Width

The width of the bottom outside flange measured at the top of the flange shall be a minimum of 1.27 mm (0.0500 inches).

Chamfers (Corner Notches)

The quantity and location of chamfer(s) is optional. If used, the chamfer must not include the flange.

SBS Proposed Standard 3e: Bottom-Outside Flange Height—Dual Flange Heights

Flange Height

The height of the bottom outside flange shall be 2.41 mm±0.38 mm (0.0948 inches±0.0150 inches) along the short sides of the plate. This is measured from Datum A (the bottom-resting plane) to the top of the flange.

The height of the bottom outside flange shall be 7.62 mm±0.38 mm (0.3000 inches±0.0150 inches) along the long sides of the plate. This is measured from Datum A (the bottom-resting plane) to the top of the flange.

Flange Width

The width of the bottom outside flange measured at the top of the flange shall be a minimum of 1.27 mm (0.0500 inches).

Chamfers (Corner Notches)

The quantity and location of chamfer(s) is optional. If used, the chamfer must not include the flange.

SBS Proposed Standard 4a: Well Positions—96 Well Multiwell Plate

Well Layout

The wells in a 96 well multiwell plate should be arranged as eight rows by twelve columns.

Well Column Position

The distance between the left outside edge of the plate and the center of the first column of wells shall be 14.38 mm (0.5661 inches)

The left edge of the part will be defined as the two 12.7 mm areas (as measured from the corners) as specified in SBS-1

Each following column shall be an additional 9. mm (0.3543 inches) in distance from the left outside edge of the plate.

Well Row Position

The distance between the top outside edge of the plate and the center of the first row of wells shall be 11.24 mm (0.4425 inches)

The top edge of the part will be defined as the two 12.7 mm areas (as measured from the corners) as specified in SBS-1

Each following row shall be an additional 9. mm (0.3543 inches) in distance from the top outside edge of the plate.

Positional Tolerance

The positional tolerance of the well centers will be specified using so called "True Position". The center of each well will be within a 0.71 mm (0.0280 inches) diameter of the specified location. This tolerance will apply at "RFS" (regardless of feature size).

Well Markings

The top left well of the plate shall be marked in a distinguishing manner.

The top left well of the plate can be marked with the letter A or numeral 1 located on the left-hand side of the well.

The top left well of the plate can be marked with a numeral 1 located on the upper side of the well.

Additional markings may be provided.

SBS Proposed Standard 4b: Well Positions—384 Well Multiwell Plate

Well Layout

The wells in a 384 well multiwell plate should be arranged as sixteen rows by twenty-four columns.

Well Column Position

The distance between the left outside edge of the plate and the center of the first column of wells shall be 12.13 mm (0.4776 inches)

The left edge of the part will be defined as the two 12.7 mm areas (as measured from the corners) as specified in SBS-1

Each following column shall be an additional 4.5 mm (0.1772 inches) in distance from the left outside edge of the plate.

Well Row Position

The distance between the top outside edge of the plate and the center of the first row of wells shall be 8.99 mm (0.3539 inches)

The top edge of the part will be defined as the two 12.7 mm areas (as measured from the corners) as specified in SBS-1

Each following row shall be an additional 4.5 mm (0.1772 inches) in distance from the top outside edge of Positional Tolerance The positional tolerance of the well centers will be specified using so called "True Position". The center of each well will be within a 0.71 mm (0.0280 inches) diameter of the specified location. This tolerance will apply at "RFS" (regardless of feature size).

Well Markings

The top left well of the plate shall be marked in a distinguishing manner.

The top left well of the plate can be marked with the letter A or numeral 1 located on the left-hand side of the well.

The top left well of the plate can be marked with a numeral 1 located on the upper side of the well.

Additional markings may be provided.

SBS Proposed Standard 4c: Well Positions—1536 Well Multiwell Plate

Well Layout

The wells in a 1536 well multiwell plate should be arranged as thirty-two rows by forty-eight columns.

Well Column Position

The distance between the left outside edge of the plate and the center of the first column of wells shall be 11.005 mm (0.4333 inches)

The left edge of the part will be defined as the two 12.7 mm areas (as measured from the corners) as specified in SBS-1

Each following column shall be an additional 2.25 mm (0.0886 inches) in distance from the left outside edge of the plate.

Well Row Position

The distance between the top outside edge of the plate and the center of the first row of wells shall be 7.865 mm (0.3096 inches)

The top edge of the part will be defined as the two 12.7 mm areas (as measured from the corners) as specified in SBS-1

Each following row shall be an additional 2.25 mm (0.0886 inches) in distance from the top outside edge of Positional Tolerance The positional tolerance of the well centers will be specified using so called "True Position". The center of each well will be within a 0.25 mm (0.0098 inches) diameter of the specified location. This tolerance will apply at "RFS" (regardless of feature size).

Well Markings

The top left well of the plate shall be marked in a distinguishing manner.

The top left well of the plate can be marked with the letter A or numeral 1 located on the left-hand side of the well.

The top left well of the plate can be marked with a numeral 1 located on the upper side of the well.

Additional markings may be provided.

It should be understood that the multiwell plate of the present invention and specifically the protein well and the reagent well need not be circular or even dimensioned in accordance with SBS standards, instead the wells may be provided in a number of alternate configurations having different cross-sectional shapes, e.g., rectangles, squares, triangles. Further, the access ports may take any shape and need not be circular.

The multiwell plate of the present invention may be made by conventional injection molding techniques. The entire piece may be molded at once in a single mold. Alternatively, two plates, one defining the matrix of reservoir wells and one defining the respective matrix of protein wells and access ports may be molded separately, and later joined by adhesive, hot pressing, or friction fit for example. The separately molded plates may alternatively be designed to mate and separate by hand. Preferably, the plastic material making up the plate is a clear cyclic-olefin, polystyrene or polypropylene. Due to its superior qualities relating to low water permeability and low absorption, as well as its inherent resistance to hydrolysis, polar organics, acids & bases, clear cyclic-olefin copolymer is the most preferred material for use in making the multiwell plate of the present invention.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A multiwell plate, comprising:
    a frame including a plurality of wells formed therein, each well including:
        a first well having a relatively large volume;
        a second well having a relatively small volume positioned such that the second well is suspended above at least some portion of the first well; and
        said second well has a hole therethrough at a lower most point whereby said hole is sized such that liquid is prevented from passing through due to surface tension.

2. The multiwell plate of claim 1, wherein each well further comprising an access port that allows fluid communication between the first well and an external environment.

3. The multiwell plate of claim 1, wherein said second well has a concave shape.

4. The multiwell plate of claim 1, wherein said frame has a footprint capable of being handled by a robotic handling system.

5. The multiwell plate of claim 1, wherein each well is positioned on said frame so as to enable a liquid handling system to automatically deposit a sample solution into said second well and to automatically deposit a reagent solution into said first well.

6. The multiwell plate of claim 1, further comprising a seal that is positioned over said plurality of wells.

7. The multiwell plate of claim 1, wherein said frame and said plurality of wells are manufactured from cyclo-olefin.

8. The multiwell plate of claim 1, wherein said frame and said plurality of wells form a multi well high-throughput protein crystallography plate.

9. A protein crystallography plate, comprising:
    a frame including a plurality of wells formed therein, each well including:
        a first well capable of receiving a reagent solution;
        a second well having a substantially concaved form capable of receiving a protein solution and a reagent solution;

said second well located over at least a portion of said first well;

said second well has a hole therethrough at a lower most point whereby said hole is sized such that the protein solution and the reagent solution are prevented from passing through due to surface tension;

wherein the reagent solution in said first well has a higher concentration than the reagent solution within said second well; and wherein the protein solution and the reagent solution within said second well interact with the reagent solution within said first well via a vapor diffusion process which enables the formation of protein crystals within said second well.

10. The multiwell plate of claim 9, wherein each well further comprising an access port that allows fluid communication between the first well and an external environment.

11. The protein crystallography plate of claim 9, wherein said frame has a footprint capable of being handled by a robotic handling system.

12. The protein crystallography plate of claim 11, wherein said robotic handling system is a Society of Biomolecular Screening compatible robotic handling system.

13. The protein crystallography plate of claim 9, wherein each well is positioned on said frame so as to enable a liquid handling system to automatically deposit the protein solution and the reagent solution into said second well and to automatically deposit the reagent solution into said first well.

14. The protein crystallography plate of claim 9, further comprising a seal that is positioned over said plurality of wells.

15. The protein crystallography plate of claim 9, wherein said frame and said plurality of wells are manufactured from cyclo-olefin.

16. A method for using a microplate to form protein crystals, said method comprising the steps of:

prepping the microplate which includes a frame having a plurality of wells formed therein, each well including:
a first well having a relatively large volume;
a second well having a relatively small volume positioned such that the second well is suspended above at least some portion of the first well; and
said second well has a hole therethrough at a lower most point whereby said hole is sized such that liquid is prevented from passing through due to surface tension, said step of prepping further includes:
depositing into the first well a reagent solution; and
depositing into the second well a protein reagent and a reagent solution; and sealing an opening of each well to enable the protein solution and the reagent solution within said second well to interact with the reagent solution within said first well via a vapor diffusion process which enables the formation of protein crystals within said second well.

17. The method of claim 16, wherein each well has an access port which is used to deposit the reagent solution into said first well.

18. A multiwell plate, comprising:
a frame including a plurality of wells formed therein, each well including:
a first well having a relatively large volume;
a second well having a relatively small volume positioned such that the second well is located above at least some portion of the first well; and
said second well has a hole therethrough.

* * * * *